United States Patent
Wu et al.

(10) Patent No.: US 7,256,872 B2
(45) Date of Patent: Aug. 14, 2007

(54) PURGING GAS FROM A PHOTOLITHOGRAPHY ENCLOSURE BETWEEN A MASK PROTECTIVE DEVICE AND A PATTERNED MASK

(75) Inventors: Han-Ming Wu, Cupertino, CA (US); Ronald J. Kuse, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/759,641

(22) Filed: Jan. 16, 2004

(65) Prior Publication Data
US 2004/0145716 A1    Jul. 29, 2004

Related U.S. Application Data

(62) Division of application No. 09/752,938, filed on Dec. 29, 2000, now Pat. No. 6,710,845.

(51) Int. Cl.
*G03B 27/32* (2006.01)
*G03B 27/52* (2006.01)
*G03B 27/42* (2006.01)

(52) U.S. Cl. ............... 355/77; 355/30; 355/53
(58) Field of Classification Search .......... 355/30, 355/53, 72–76; 430/5, 22, 30, 20, 311; 378/34, 378/35; 250/559.4, 559.41; 356/237.2, 356/237.5
See application file for complete search history.

(56) References Cited

U.S. PATENT DOCUMENTS

| | | | |
|---|---|---|---|
| 5,422,704 A | 6/1995 | Sego | |
| 5,453,816 A | 9/1995 | Wang | |
| 5,529,819 A | 6/1996 | Campi, Jr. | |
| 5,559,584 A | 9/1996 | Miyaji et al. | |
| 5,735,961 A * | 4/1998 | Shimada | 118/724 |
| 5,793,836 A | 8/1998 | Maldonado et al. | |
| 5,814,381 A | 9/1998 | Kuo | |
| 6,153,044 A | 11/2000 | Klebanoff et al. | |
| 6,317,479 B1 | 11/2001 | Chiba et al. | |
| 6,380,518 B2 * | 4/2002 | Shirakawa et al. | 219/390 |
| 6,507,390 B1 * | 1/2003 | Ivaldi | 355/75 |
| 6,542,220 B1 | 4/2003 | Schrijver et al. | |
| 6,593,034 B1 * | 7/2003 | Shirasaki | 430/5 |

* cited by examiner

*Primary Examiner*—Henry Hung Nguyen
(74) *Attorney, Agent, or Firm*—Blakely, Sokoloff, Taylor & Zafman LLP (57) ABSTRACT

A method and apparatus are described for removing an initial gas from a gas-filled enclosure between the mask-protective device, such as a pellicle, and the patterned mask, such as a reticle, and adding a purge gas with a different composition. The gas-filled enclosure includes a vent for adding the purge gas to the chamber and removing the initial gas from the chamber. Adding and removing may be accomplished by using pressure, diffusion, vacuum, or other means.

17 Claims, 7 Drawing Sheets

PURGING GAS FROM A PHOTOLITHOGRAPHY ENCLOSURE BETWEEN A MASK PROTECTIVE DEVICE AND A PATTERNED MASK

The present application is a divisional of U.S. patent application Ser. No. 09/752,938, filed Dec. 29, 2000, now U.S. Pat. No. 6,710,845 entitled "PURGING GAS FROM A PHOTOLITHOGRAPHY ENCLOSURE BETWEEN A MASK PROTECTIVE DEVICE AND A PATTERN MASK".

BACKGROUND OF THE INVENTION

1. Field of the Invention

The invention relates generally to a method and apparatus for making semiconductor devices using lithography. More particularly, the invention relates to a gas-filled enclosure between a mask protective device and a patterned mask, and a method and apparatus for removing a gas from the enclosure and adding a different gas.

2. Background Information

Photolithography is a process frequently used in processes to manufacture semiconductor devices. During photolithography, a light-sensitive layer on a semiconductor device is selectively exposed to light through the use of a reticle or mask. Light is transmitted toward the light-sensitive layer, through the reticle, which contains transparent regions that transmit light to the light-sensitive layer and opaque regions that prevent exposure of certain areas of the light-sensitive layer to the light. Typically, the reticle is a transparent quartz plate with a pattern defined by opaque chrome included on one side of the quartz plate. The transparent and opaque regions are associated with circuitry to be created on the semiconductor device. The exposed portions of the light-sensitive layer are transformed, allowing them to be removed by solvents, to create the circuitry of the semiconductor device.

Figure 1:
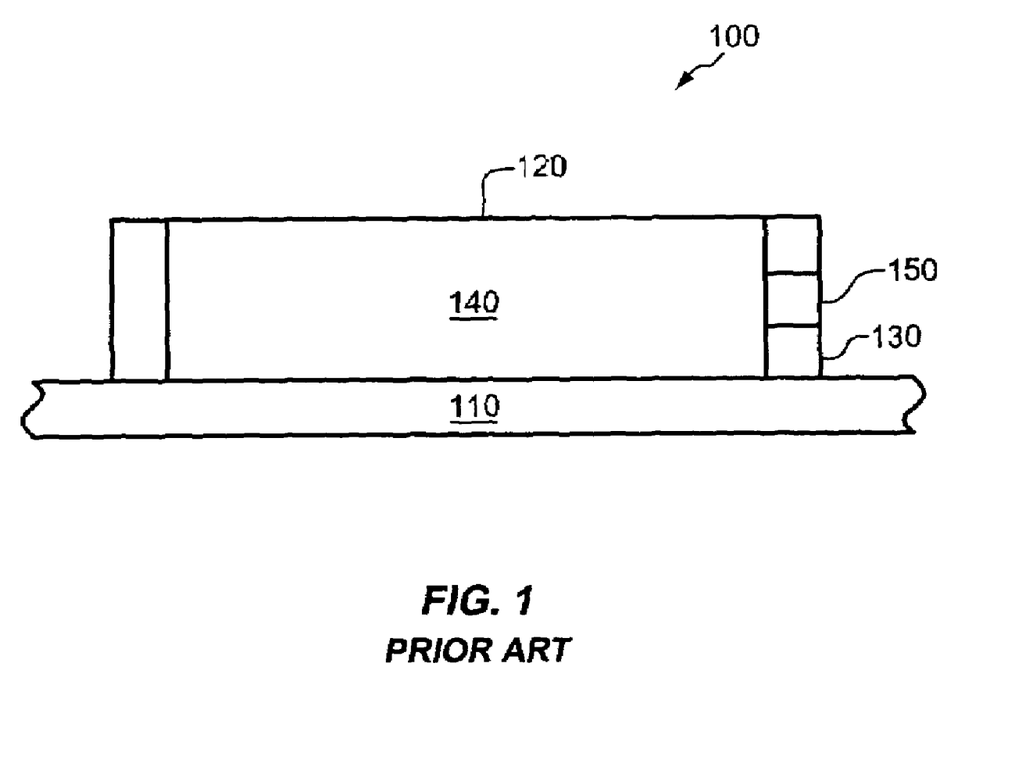
FIG. 1 shows a cross-sectional view of a prior art pellicle and reticle system.

FIG. 1 shows a prior art pellicle-reticle system 100. The pellicle-reticle system 100 includes a reticle 110 protected from ambient particles, by a pellicle 120. The pellicle 120 is typically a light-transparent polymeric film attached to a rigid frame. Particles, such as airborne particles, settle on the pellicle 120, rather than on the reticle 110. The pellicle 120 is typically separated from the reticle 110 by a short distance sufficient to eliminate or dissipate effects of particles on the surface of the pellicle 120 from creating a shadow on the reticle 110 or on a semiconductor device. Without the pellicle 120, such particles could create unintended images on the semiconductor device and alter the circuitry. Accordingly, the pellicle 120 allows particles to be collected a short distance away from the reticle 110, where they will be out of focus on the wafer surface, and will not generate circuitry defects.

The pellicle 120 is typically connected to the reticle 110 by a wall 130. The pellicle 120, the reticle 110, and the wall 130 create an enclosed volume 140, typically of air. A single, small pressure equalization orifice 150 is typically provided to equalize the pressure across the pellicle 120. This orifice 150 prevents changes in the pressure of the enclosed volume, or ambient air from damaging or altering optical properties of the pellicle 120. The orifice 150 is made small to discourage external particles from entering the enclosed volume 140 and surfacing directly on the reticle 110. For example, considering an enclosed volume approximately 115 mm in length and 90 mm in width, the single, small orifice 150 is typically less than approximately 3 mm in length by 1 mm in height. For the same reason, the orifice 150 is sometimes a convoluted passageway in order to trap particles in the passageway before entering the enclosed volume. Multiple orifices are not used, since multiple orifices promote convective flow into and out of the enclosure, which is not desired. The primary purpose of the pellicle 120 is to keep particles off of the surface of the reticle 110. Thus, only a single small orifice 150 has been used in prior art pellicle-reticle systems.

The wavelength of the light affects the size of the circuitry that can be produced by photolithography. Shorter light wavelengths allow circuits with smaller features to be produced. Likewise, single-frequency light allows smaller circuitry to be produced than multi-frequency light. Ultraviolet light has traditionally been used. Common wavelengths are 436 nm (called G-Line), 405 nm (H-line), 365 nm (I-line) and 248 nm (called Deep UV), and 193 nm. Prior art photolithography methods and apparatus based on these frequencies have been conducted in ambient temperature, humid air, since nitrogen ($N_2$), oxygen ($O_2$), water ($H_2O$), and carbon dioxide ($CO_2$) do not appreciably absorb ultraviolet light at these frequencies.

Shorter-wavelength ultraviolet light, such as 157 nm, may be used to produce even smaller circuitry features. However, oxygen and carbon containing species present in normal atmospheric air, such as oxygen ($O_2$), water vapor ($H_2O$), and carbon dioxide ($CO_2$), absorb 157 nm ultraviolet light. This may cause irregularities and imperfections in the circuits produced. Unfortunately, due to the single, small orifice 150 and the prior art motivation to minimize airflow into and out of the enclosure, prior art photolithography methods and apparatus are not satisfactory for removal of these species.

BRIEF DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DETAILED DESCRIPTION OF THE INVENTION

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various operations, which will be described below. The operations of the present invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software.

Exemplary Use of the Invention in Semiconductor Processing

Figure 2:
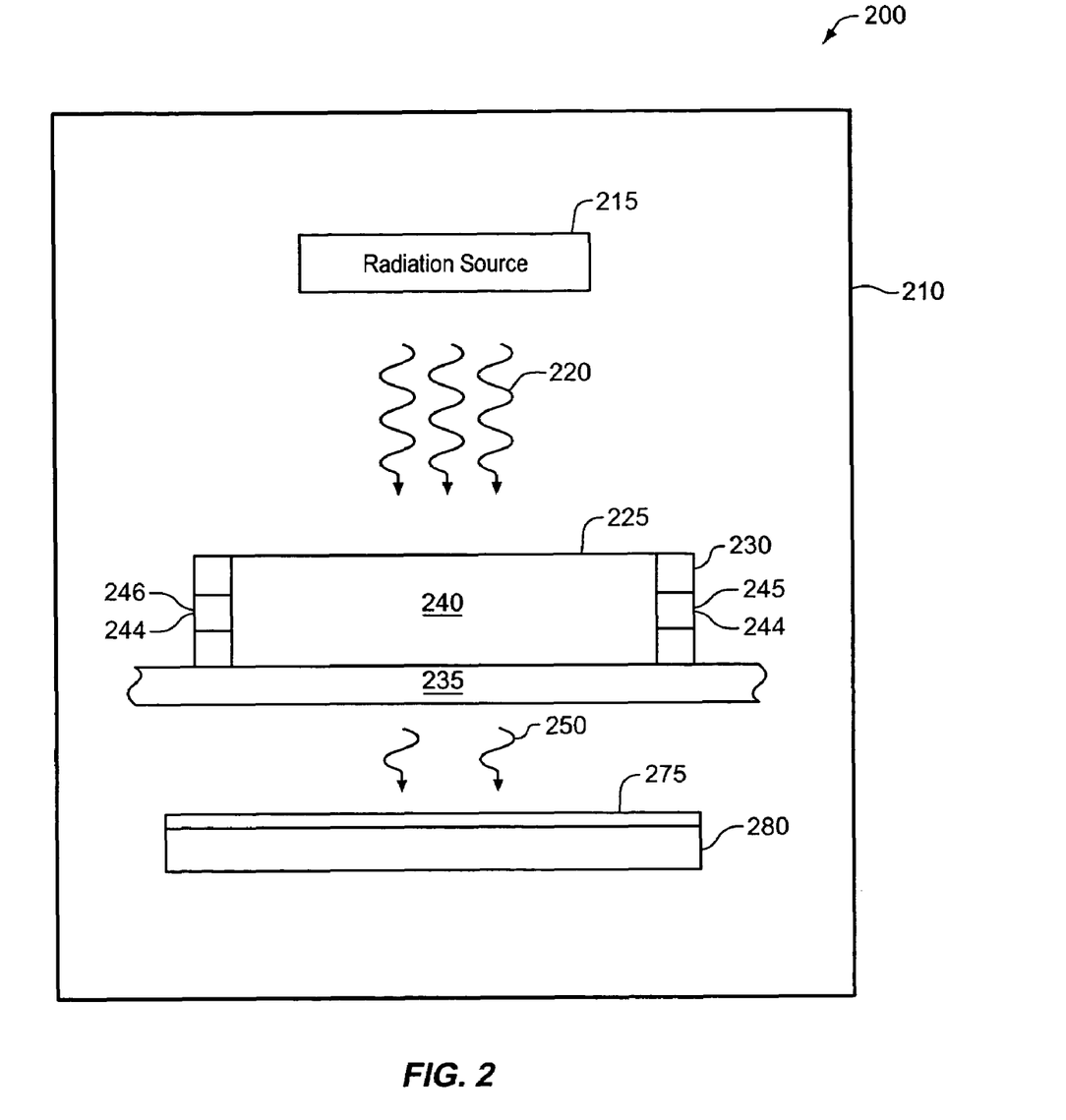
FIG. 2 shows use of the invention to expose a radiation-sensitive layer on a semiconductor device to a radiation source, according to one embodiment of the present invention.

The present invention relates to photolithography, which is used in many semiconductor-manufacturing processes. FIG. 2 shows a photolithography system 200 according to one exemplary embodiment of the present invention, in which a radiation-sensitive layer 275 on a semiconductor device 280 may be selectively exposed to radiation 250 via a patterned mask 235, such as a reticle. Initially, a silicon wafer is cut from a pure silicon ingot and heat and gas is applied to create a silicon dioxide (SiO2) layer on the semiconductor device 280. The silicon dioxide layer is coated with a radiation-sensitive layer 275, such as a photoresist, that is physically or chemically transformed when exposed to light during photolithography.

A radiation source 215 is used to generate and transmit radiation 220 toward the radiation-sensitive layer 275. The radiation 220 may be any radiation, such as light, ultraviolet light, x-rays, or other electromagnetic radiation, that is able to chemically or physically transform the radiation sensitive layer 275. The radiation 220 maybe photolithography radiation, such as 248 nm, 198 nm, 157 nm, and shorter wavelengths such as extreme ultraviolet radiation (e.g., 10-20 nm) for use in making semiconductor devices. The radiation 220 is transmitted to the mask protective device 225.

The term, mask protective device, refers to a device that protects the patterned mask. For example, the mask protective device may prevent particles from contacting the patterned mask. The mask protective device may be a pellicle, which is well known in the art. The mask protective device may be fixedly or removably attached to the patterned mask. Typically adhesives or adhesive strips are used, but clamps, magnets, suction cups, or other means may also be used. According to one embodiment the mask protective device includes a portion that is sufficiently transparent to the radiation 220. Typically, the mask protective device will be made of polymeric materials, but may also be made of inorganic materials, or a combination of inorganic and organic materials. Depending on the materials and the intended use, the mask protective device may be a thin, flexible, transparent film, such as a membrane attached to a rigid metal frame, or may be a rigid sheet, such as a sheet of special glass or quartz. In one implementation, the mask protective device 225 is made of a material that is able to withstand exposure to 157 nm radiation for a sufficient period of time for the intended application.

The mask protective device 225 is connected with the patterned mask 235 by a wall 230. The wall may be any structural connector attached to or coupled with both the mask protective device and the patterned mask to connect them and define a gas-filled enclosure. The wall 230 may have few openings to prevent particles from entering the enclosure 240, or the wall 230 may have numerous openings, or be a simple wire frame. The latter may be appropriate when the mask protective device 225 and the patterned mask 235 are enclosed in a nearly airtight chamber that provides sufficient protection from particles. For example, the wall 230 may be an aluminum wall attached to the mask protective device 225 and the patterned mask 235 with an adhesive. The invention is not limited by the shape, structure, or complexity of the wall. For example, the wall may include multiple layers that present a tortuous path that particles must traverse to enter the enclosure.

The mask protective device 225, the patterned mask 235, and the wall 230 create a gas-filled enclosure 240 that is initially filled with an initial gas, such as humidified air. The enclosure 240 may be any enclosure that is between the mask protective device and the patterned mask. For example, the wall may be combined with either the mask protective device or the patterned mask. Also, the shape of the enclosure 240 may be square, rectangular, circular, or of any arbitrary shape. The radiation 220 is transmitted through the transparent mask protective device 225, transmitted through the gas-filled enclosure 240, may be partially absorbed by the gas in the gas-filled enclosure 240, and is transmitted to the patterned mask 235. The term gas refers to pure component gases or gas mixtures.

The present invention may be used to add purge gas to the enclosure 240 and remove initial gas from the enclosure 240 before transmitting the radiation 220 toward the enclosure 240, through a vent 244. The term initial gas refers to the gas that is in the enclosure 240 from the time just before adding purge gas to the enclosure 240 until just before the time when addition of purge gas to the enclosure 240 is stopped because the initial gas has been removed from the enclosure 240 to the desired or sufficient extent. The gas in the enclosure 240 may be substantially homogeneous or quite heterogeneous in composition or chemical concentration. For example, the concentration of gas near the inlet opening 245 may be close to the purge gas concentration, and the concentration of gas near the outlet opening 246 may be close to the concentration of the initial gas before addition of purge gas to the enclosure 240. The term purge gas refers to the gas added to the enclosure 240.

The motivation for adding the purge gas and removing the initial gas is not a limitation of the invention. Frequently, the initial gas has a limiting property or characteristic, such as a limiting property that varies with the concentration of a species in the initial gas, and that is not desired for the particular application. For example, the initial gas may be reactive, corrosive, or have other limitations relative to the purge gas. In photolithography applications, the initial gas may not transmit the radiation 220 as well as the purge gas transmits the radiation 220. For example, the initial gas may be humid air containing oxygen and carbon containing molecules such as oxygen ($O_2$), water ($H_2O$), carbon dioxide ($CO_2$) and other species that absorb the radiation 120 more than the purge gas. Alternatively, the initial gas may reflect or scatter more than the purge gas, or may have a lower transmissivity for other reasons. Transmissivity is the ratio of the directly transmitted light after passing through one unit (e.g., a length, a molar volume, a constant molar density volume) of the participating medium, such as the gas, to the amount of light that would have passed the same distance through a vacuum. The purge gas may be a gas or gas mixture that does not have the limitation associated with the initial gas, or has the limitation to a lesser extent. For example, the purge gas may be nitrogen, helium, a noble gas, a gas that absorbs the radiation 220 less than the initial gas, or a mixture of such gases. According to one embodiment, the purge gas has a lower concentration of oxygen and carbon containing species than ambient air. Purging is done until the concentration of oxygen and carbon containing species has been reduced to any desired extent, such as 1 ppm.

The enclosure 240 is an enclosure in accordance with one embodiment of the present invention. Other enclosures and embodiments will be discussed below. The enclosure 240 includes vent 244 that allows purge gas to be added to the enclosure and initial gas removed from the enclosure. The vent 244 includes a first inlet opening 245 and a second outlet opening 246 to add and remove gas. The openings may be in any arrangement, although arrangements that encourage good flow, such as flow without vortexes and mixing, are preferred. A first quantity of a purge gas with a different composition and higher pressure than the initial gas inside the enclosure 240 is added through the first opening 245. The first quantity of purge gas may be passed through a filter, such as a filter that retains 0.05 micron and larger particles, located at the first inlet opening 245 or elsewhere. A second quantity of initial gas, nearly equal in volume to the first quantity of purge gas, is removed through the second outlet opening 246. The second quantity of initial gas may be passed through a filter, although this may be less useful than filtering the purge gas. Thus, the initial gas may be removed from the enclosure 240 and a different purge gas, such as a gas that better transmits radiation 220, may be added to the enclosure 240.

The patterned mask 235 includes both sufficiently transparent and opaque regions. For example, the patterned mask may be a photomask, a reticle, or a composite of a radiation-transparent support to which a radiation-opaque pattern has been applied. For example, the patterned mask 235 may be a transparent quartz base to which a pattern in opaque chrome has been applied. The pattern shields a portion of the radiation that is transmitted by the gas-filled enclosure 240 from the radiation-sensitive layer 275 to create a pattern on the radiation-sensitive layer. Accordingly, the patterned mask 235 transmits radiation 250, which is only a portion of radiation 220, toward the radiation-sensitive layer 275.

The radiation 250 is received at the radiation-sensitive layer 275 on the semiconductor device 280. The portion of the radiation-sensitive layer 275 that is exposed to the radiation 250 is chemically or physically transformed to create a pattern in the radiation-sensitive layer 275. Typically, the exposed radiation-sensitive layer is removed with solvent to selectively expose the silicon dioxide layer beneath the radiation-sensitive layer, according to the pattern. The exposed silicon dioxide may then be selectively processed to produce features, such as electrical circuitry.

A chamber 210 surrounds the photolithography system 200 discussed above. Such chambers will be discussed further below. The chamber 210 will frequently be a part of the photolithography system 200, although different portions of the system may be enclosed in the chamber 210.

The discussion above is to illustrate how the invention may be used with one implementation of photolithography in the production of semiconductor devices, rather than to limit the invention. Accordingly, the invention is not limited to any particular radiation source 215, radiation 210, 220, 250, 270, projection unit 215, aperture 255, lens 260, support 265, radiation sensitive layer 275, semiconductor device 280, or support 285. According to one embodiment, the invention may be used in any process that may be improved by removing one gas from an enclosure and adding another gas, wherein the enclosure is defined by a structure that includes both sufficiently transparent and sufficiently opaque regions to define a pattern, and wherein radiation is to be transmitted through the transparent regions and the gas filling the enclosure, to produce an effect based on the pattern.

Purging the Chamber Using Pressure

Figure 3:
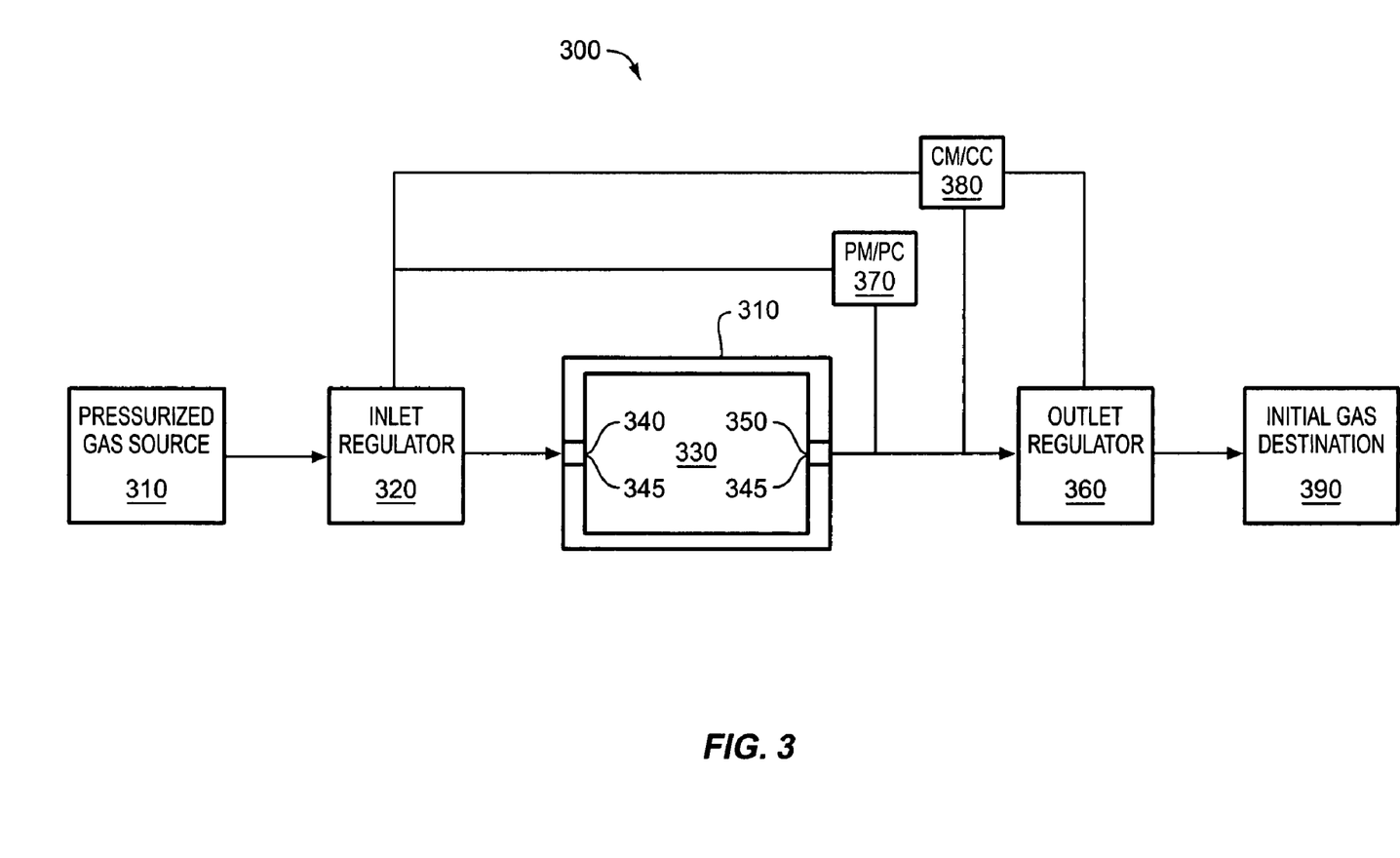
FIG. 3 shows a system for adding purge gas and removing initial gas from an enclosure, according to one embodiment of the present invention.

FIG. 3 shows a system 300 for purging a convection-purged enclosure 330, in which pressure is used to add and remove gas from convection-purged enclosure 330, according to one embodiment of the present invention. The pressurized gas source 310 includes a first quantity of purge gas, at a higher pressure than the initial gas in the convection-purged enclosure 330, and which is to be added to the convection-purged enclosure 330. The pressurized gas source 310 may be a pressurized vessel (e.g., a tank, cylinder, or other vessel) containing the first quantity of purge gas, a source including a pressure-increasing device (e.g., a blower, compressor, pump, or other device) or other pressurized gas source containing the first quantity of purge gas. Alternatively, the pressurized gas source may be a blower that pulls gas from a source, such as atmospheric gas or initial gas from the convection-purged enclosure 330, processes the gas, such as to remove an undesirable characteristic of the gas, and adds the processed gas to the convection-purged enclosure 330.

The pressurized gas source 310 is connected with the convection-purged enclosure 330 to allow addition of the first quantity of purge gas to the convection-purged enclosure 330. For example, the connection may include a duct, pipe, tubing, or other means. Typically the pressurized gas source 310 is connected to the convection-purged enclosure 330 via an inlet regulator 320 to provide some control or management of the addition of the purge gas to the convection-purged enclosure 330. The inlet regulator may be a flow-restricting device, an opening and closing device, a variable speed blower or compressor, or any other device that allows management or control of the rate or quantity of addition of the purge gas. The inlet regulator 320 may be a manual regulator, such as a valve on a pressurized vessel. The inlet regulator 320 may also be a cover, seal, stopper, or other device that decouples the convection-purged enclosure 330 from the pressurized gas source 310 and provides a sufficiently airtight seal between the convection-purged enclosure 330 and the pressurized gas source. Alternatively, the inlet regulator 320 may be an automatically controlled device, such as a control valve, that communicates with measurement devices and controllers. This permits automated management and control of adding the purge gas to the convection-purged enclosure 330.

The convection-purged enclosure 330 is a rectangular-shaped enclosure between a mask protective device and a patterned mask, typically having a larger length and width compared to the height of the enclosure, where the height is in a direction separating the mask protective device and the patterned mask. Alternatively, the convection-purged enclosure 330 may have any arbitrary shape sufficient for the intended application. For example, rather than a squat rectangle, the convection-purged enclosure 330 may be a cylinder. A wall 310 connects the mask protective device with the patterned mask. The convection-purged enclosure 330 includes a vent 345 to allow purge gas to be added to the enclosure and initial gas to be removed from the enclosure. The vent is typically created through one or more openings in the wall. The vent 345 includes an inlet opening 340 and an outlet opening 350. The convection-purged enclosure 330 may also include a hole for pressure equalization, or may use all or a portion of either the inlet opening 340 or the outlet opening 350 for pressure equalization. A portion of the inlet opening 340 may be used for pressure equalization. This allows primarily purge gas to be added to the convection-purged enclosure 330 due to pressure equalization. Pressure is used to add the first quantity of a purge gas to the convection-purged enclosure 330 through the inlet opening 340 and remove a second quantity of initial gas from the convection-purged enclosure 330 through the outlet opening 350.

The outlet opening 350 is connected with an initial gas destination 390 to allow removal of the second quantity of initial gas from the convection-purged enclosure 330 to the initial gas destination 390. For example, the connection may include a duct, pipe, tubing, or other means. Typically the convection-purged enclosure 330 is connected to the initial gas destination 390 via an outlet regulator 360 to provide some control or management of the removal of the initial gas from the convection-purged enclosure 330. The outlet regulator 360 may include any of the features of the inlet regulator 320 previously discussed, and may be the same or different from the inlet regulator 320. The initial gas destination 390 may be any suitable destination for the second quantity of initial gas. Frequently, the initial gas destination 390 has a lower pressure than the convection-purged enclosure 330 connected with the purge gas source, so that initial gas is naturally removed from the convection-purged enclosure 330 to the initial gas destination by pressure. For certain initial and purge gases and applications, such as when the initial gas is air and the purge gas is a non-toxic gas such as nitrogen, the second quantity of initial gas may be vented directly from the convection-purged enclosure 330. At least partial destruction of the gas, or removal or destruction of certain species may be desirable for certain gases. For instance, the second quantity of initial gas may be passed through an oxidizer, a catalyst, an adsorbent, or otherwise be processed.

The convection-purged enclosure 330 may be managed or controlled by using a pressure measurement-pressure control (PM/PC) unit 370 and/or a concentration measurement-concentration control (CM/CC) unit 380. The PM/PC unit measures pressure inside convection-purged enclosure 330, or at some other location, such as between the convection-purged enclosure 330 and the outlet regulator 360, which is either close to the pressure inside the enclosure or can be used to infer the pressure inside the enclosure. The PM/PC unit 370 may adjust the inlet regulator 320, the outlet regulator 360, or both to control the pressure inside convection-purged enclosure 330 at a predetermined level, such as a setpoint pressure. For example, the PM/PC unit may cause the inlet regulator 320 to increase the rate of addition of purge gas to convection-purged enclosure 330 if the pressure inside the enclosure is low, or decrease the rate if the pressure is high. Any existing or future technology for measuring and controlling pressure may be used. The CM/CC unit 380 measures gas concentration inside the convection-purged enclosure 330, sufficiently away from the inlet opening 340, or between the convection-purged enclosure 330 and the initial gas destination 390. According to one embodiment the CM/CC unit 380 measures the gas phase concentration continually until the concentration reaches a predetermined level and then instructs the system that the purging process is completed, such as by causing the inlet regulator 320 and the outlet regulator 360 to decouple the convection-purged enclosure 330 from the pressurized gas source 310 and the initial gas destination 390, respectively. For example, the CM/CC unit 380 may measure the absorption of 157 nm radiation by a known amount of gas (e.g., a fixed length with temperature and pressure density correction) exiting the convection-purged enclosure 330 until the absorption decreases to the extent expected or calibrated for nitrogen containing 1 ppm oxygen. As a first approximation, absorption decreases approximately linearly with oxygen concentration.

Figure 4:
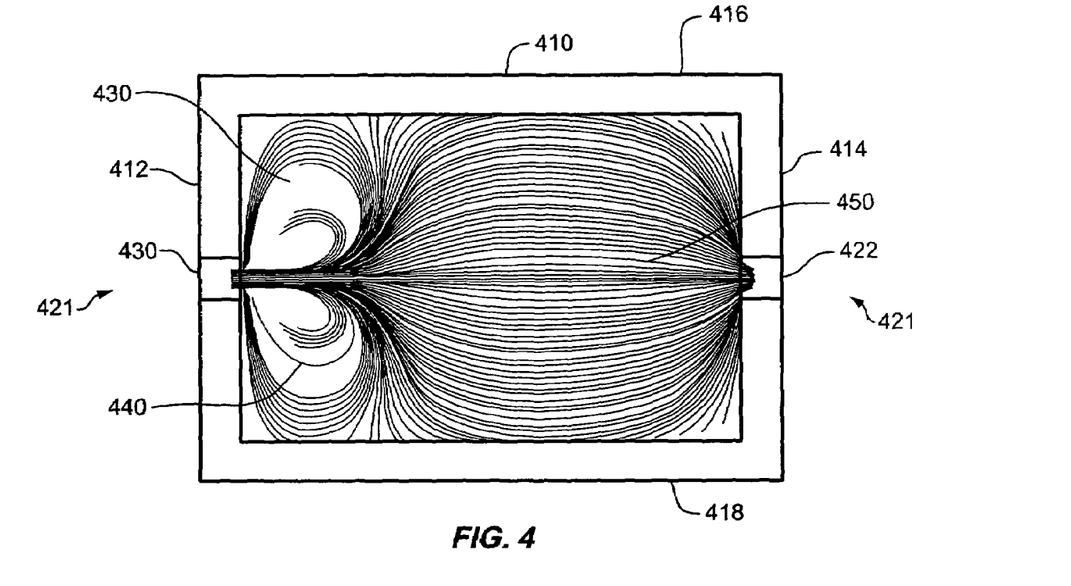
FIG. 4 shows an enclosure and conceptual flow pattern for the enclosure, according to one embodiment of the invention.

FIG. 4 conceptually shows flow patterns for purging a mixed enclosure 400 that may have any of the characteristics discussed above for the convection-purged enclosure 330. The mixed enclosure 400 includes a wall 410 that connects a mask protective device with a patterned mask. The wall 410 includes a first side 412, a second side 414 opposite the first side, a left side 416, and a right side 418 opposite the left side. The mixed enclosure 400 includes a vent 421 to allow purge gas to be added and initial gas to be removed. The vent 421 includes an inlet opening 420 and an outlet opening 422.

Different volumes of purge gas entering the mixed enclosure 400 may be removed from the mixed enclosure 400 relatively quickly (i.e., with low residence times) or may be delayed in the enclosure (i.e., have higher residence times) based on the flow path taken through the enclosure 400. For example, the regions 430, 440 near the inlet opening 420 show back mixing and vortex formation. This may reduce the purging efficiency and more purge gas may be needed to remove initial gas from the mixed enclosure 330 to the same final concentration. In contrast, flow through region 450, proximate the centerline of the mixed enclosure 330 connecting the inlet opening 420 with the outlet opening 422, has less mixing and is more efficient for removing the initial gas from the mixed enclosure 400.

The inlet opening 420 and the outlet opening 422 may be sized to efficiently purge the mixed enclosure 400. The inlet opening 420 may be sized large enough to provide low inlet velocities and reduce back mixing caused by vortex formation. For example, the inlet opening 420 may be sized large enough that the inlet velocity is less than 20 centimeters per second. The inlet opening may also have a shape that distributes the flow over a larger length of the first side 412, such as a slit aligned with the length of the first side 412. According to some embodiments the outlet opening 422 is larger than the inlet opening 420 to prevent the pressure in the mixed enclosure 400 from becoming high, which could damage or alter the radiation-transmitting properties of the enclosure boundaries.

The inlet opening 420 and the outlet opening 422 may be located to efficiently purge the mixed enclosure 400. For example, the inlet opening 420 and the outlet opening 422 may be designed and located to promote plug flow, and to discourage back mixing, which may decrease the average residence time and increase purging efficiency. The inlet opening 420 may be on a first side of the mixed enclosure 400 and the outlet opening 422 may be on a second side of the mixed enclosure 400 opposite the first side. For example, as shown for the mixed enclosure 400, the inlet opening 420 and the outlet opening 422 are located toward the center of each of the shorter pair of opposing sides. This may allow the mixed enclosure 330 to be purged to a desired extent using a reduced volume of purge gas. Flow distributors, such as nozzles on the enclosure openings, and internal flow regulators, such as transparent baffles may also be used to improve purging efficiency, such as by reducing mixing.

Figure 5:
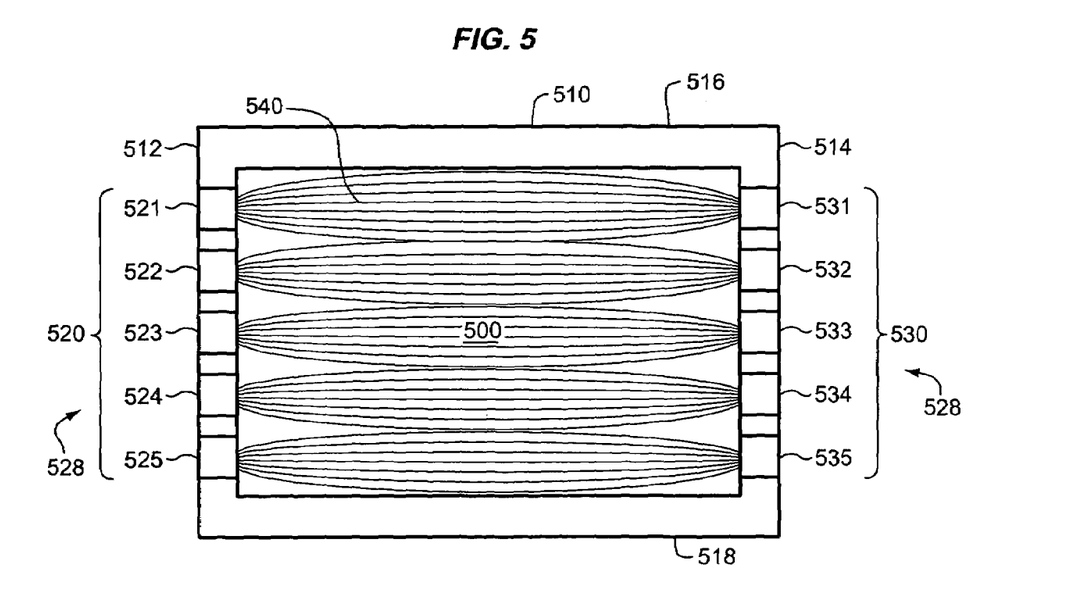
FIG. 5 shows an enclosure and conceptual flow pattern for the enclosure, according to one embodiment of the invention.

FIG. 5 conceptually shows flow patterns for purging an unmixed enclosure 500 that may have any of the characteristics discussed above for convection-purged enclosure 330. Unmixed enclosure 500 includes a wall 510 that connects a mask protective device with a patterned mask. Wall 510 includes a first side 512, a second side 514 opposite the first side, a left side 516, and a right side 518 opposite the left side. Unmixed enclosure 500 includes a vent 528. The vent 528 including an inlet 520 including a first port 521, second port 522, third port 523, fourth port 524, and an outlet 530 including a first port 531, second port 532, third port 533, fourth port 534, fifth port 535.

The conceptualized gas flow 540 in the unmixed enclosure 500 has less mixing than in the mixed enclosure 400 due to providing the plurality of inlet ports 521, 522, 523, 524, and 525. For example, the vortexes 430, 440 from the mixed enclosure 400 are nearly absent in the unmixed enclosure 500. A larger percentage of the gas added to the unmixed enclosure 500 through the inlet 520 proceeds directly toward the outlet 530 than in the mixed enclosure 400. Likewise, different volumes of purge gas entering the unmixed enclosure 500 have more similar residence times compared to the mixed enclosure 400. The unmixed enclosure 500 may be more efficient to purge than the mixed enclosure 400, and it may be possible to remove the initial gas from the unmixed enclosure 500 to the same extent with a smaller quantity of purge gas compared with the mixed enclosure 400.

The inlet ports 521, 522, 523, 524, 525 and the outlet ports 531, 532, 533, 534, 535 may be sized and shaped to efficiently purge the unmixed enclosure 500. Any number of the inlet ports 521, 522, 523, 524, 525 and outlet ports 531, 532, 533, 534, 535 may have any of the characteristics of the inlet and outlet openings 420, 422. For example, a port may have a size that maintains the inlet velocity below a threshold. The ports will often be sized and shaped similarly; although they may also be sized and shaped differently, such as if they are to alternate in size and shape. The outlet 530 may include more ports or have larger ports, to facilitate flow out of the unmixed enclosure 500.

The inlet ports 521, 522, 523, 524, 525 and the outlet ports 531, 532, 533, 534, 535 may be located to efficiently purge the unmixed enclosure 500. For example, they may be located to promote plug flow through the unmixed enclosure 330, reduce mixing or back mixing, to eliminate stagnant zones within the unmixed enclosure 500, reduce the variation in residence time, or otherwise increase purging efficiency. Often, a majority of the inlet ports 521, 522, 523, 524, 525 are on a first side of the unmixed enclosure 500 and a majority of the outlet ports 531, 532, 533, 534, 535 are on a second opposite side of the unmixed enclosure 500. This may permit the unmixed enclosure 500 to be purged with a small volume of purge gas. According to one embodiment, the arrangement and size of the plurality of inlet ports 521, 522, 523, 524, 525 promotes equal distribution of the flow across each cross sectional area through the unmixed enclosure 500 perpendicular to the net flow direction. This may reduce the variation in residence times. Alternatively, the inlet ports 521, 522, 523, 524, 525 and outlet ports 531, 532, 533, 534, 535 may be distributed in any arrangement and assume any number of sizes and shapes.

Consider an exemplary unmixed enclosure filled with air and purged with nitrogen, according to one embodiment of the present invention. The enclosure has a length of 115.8 mm, a width of 93.8 mm, and a height of 4 mm. The unmixed enclosure has an inlet with 10 ports, each rectangular slits 3.5 mm in length and 1 mm in height. The total flow rate through the enclosure is 192 standard cubic centimeters of gas per minute (sccm). This creates an inlet velocity of 0.1 meters per second through each hole. The enclosure includes an outlet with ten outlet ports with the same size and shape. The pressure in the enclosure may increase by about 0.03 Pascal, which is insignificant for most applications (e.g., traditional pellicles). The total time to purge the chamber to 1 ppm air is approximately 219 seconds.

Purging the Chamber Using Diffusion

Figure 6:
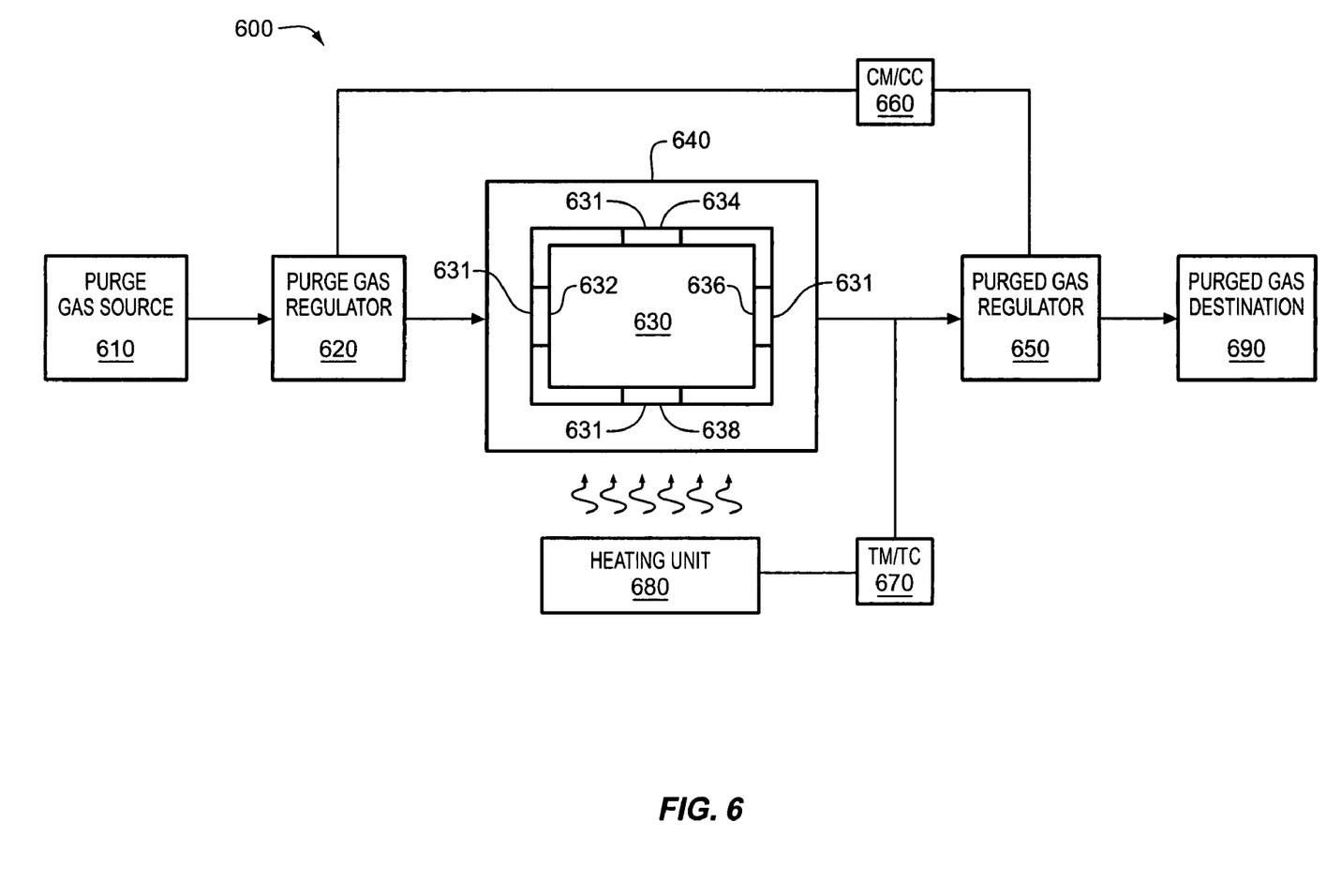
FIG. 6 shows a system for adding purge gas and removing initial gas from an enclosure, according to one embodiment of the present invention.

FIG. 6 shows a system 600 for purging a diffusion-purged enclosure 630, in which differences in concentration are used to add purge gas to the diffusion-purged enclosure 630 and remove initial gas from the diffusion-purged enclosure 630, according to one embodiment of the present invention. The purge gas source 610, purge gas regulator 620, purged gas regulator 650, CM/CC unit 660, and purged gas destination 690 may have any of the characteristics of the pressurized gas source 310, inlet gas regulator 320, outlet regulator 360, CM/CC unit 380, and initial gas destination 390 discussed above. Additionally, the diffusion-purged enclosure 630 may have any of the characteristics of the enclosures 330, 400, or 500 discussed above.

The purge gas source 610 is connected with the chamber 640, typically via the purge gas regulator 620, to allow addition of the quantity of purge gas to the chamber 640. The chamber 640 is a structural enclosure larger than and surrounding diffusion-purged enclosure 630. The chamber 640 may be a permanent structural enclosure around the diffusion-purged enclosure 630 that may include transparent portions that transmit photolithography radiation. Alternatively, the chamber 640 may be constructed or assembled before or as part of the purging process. For example, a portion of the chamber 640 may exist around the diffusion-purged enclosure 630, and assembling the chamber 640 may include placing a lid or cover over an open end of the chamber 640. Alternatively, the chamber 640 may exist separately from the photolithography equipment and the diffusion-purged enclosure 630, such as in a separate room, and the diffusion-purged enclosure 630 may be relocated to that room, placed in the chamber 640, and the chamber sealed prior to the purging process. According to one embodiment, the chamber 640 maintains an enriched composition of purge gas, relative to the composition in the diffusion-purged enclosure 630. The chamber 640 may not need to be air tight, since leaks in or out may be compensated for by purging gas from the chamber 640 at some sufficient rate. Purging from the chamber 640 may also prevent the concentration of initial gas from increasing enough in the chamber 640 to reduce diffusion rates.

The chamber 640 receives the quantity of purge gas from the purge gas source 610, and maintains the quantity of purge gas proximate the diffusion-purged enclosure 630 to allow the purge gas to diffuse into diffusion-purged enclosure 630 and allow initial gas inside the diffusion-purged enclosure 630 to diffuse into the chamber 640. Typically diffusion will occur through a macroscopic opening in the diffusion-purged enclosure 630. For example, the diffusion-purged enclosure 630 may include a single sufficiently large opening, or a plurality of openings of any size and in any arrangement, that may allow purge gas to diffuse in and initial gas to diffuse out, based on a concentration gradient at the opening. For example, the combined surface area of the openings on the wall 631 will typically be at least 10 percent of the total surface area of the wall 631, which is larger than for pressure equalization. This may be a fast and economical construction. According to other embodiments, diffusion could also occur through a plurality of microscopic openings, such as a mesh or a porous ceramic membrane, or diffusion could occur through a gas permeable membrane. This may reduce particle intrusion into the diffusion-purged enclosure 630 by providing a tortuous path of traversal to the particles. Additionally, the chamber 640 may be equipped with a flow regulator, such as a baffle, to divert flow entering the chamber 640 from directly entering the diffusion-purged enclosure 630.

The diffusion-purged enclosure 630 is an enclosed volume between a mask protective device, a patterned mask, and walls 631 that connects the mask protective device with the patterned mask. The diffusion-purged enclosure 630 has a vent 631 that includes a first opening 632, a second opening 636 on a side opposite the first opening, a third opening 634, and a fourth opening 638 opposite the third opening. Alternatively, the vent 631 could have any number of openings of any sizes and shapes. The openings may be in any arrangement, although arrangements where all points in the enclosure are close to an opening are preferred, since such arrangements reduce the risk of stagnant regions that are difficult to purge. The openings 632, 634, 636, and 638 allow purge gas to diffuse from the chamber 640 into the diffusion-purged enclosure 630 and allow initial gas to diffuse from the diffusion-purged enclosure 630 into the chamber 640.

The temperature of gas in the chamber 640 and/or gas in the diffusion-purged enclosure 630 may be increased by a heating unit 680, such as a radiation heating unit using infrared radiation. Alternatively, the purge gas could be preheated, conduction could be used to heat the gas in the diffusion-purged enclosure 630, or heating could be achieved by other conventional means. The heating unit 680 may be managed or controlled by a temperature measurement-temperature control (TM/TC) unit 670. The TM/TC unit 670 measures a temperature associated with the heated gas, such as the temperature inside the diffusion-purged enclosure 630 or the temperature of the gas removed from the chamber 640, and manages or controls the rate or extent of heating. For example, when the measured temperature is lower than desired, the TM/TC unit 670 may activate heating unit 680.

Purged gas, including purge gas and initial gas, is removed from the chamber 640 to a purged gas destination 690, typically via the purged gas regulator 650. The concentration measurement-concentration control (CM/CC) unit 660 may be used to manage or control the purge gas regulator 620 and the purged gas regulator 650.

Consider an exemplary diffusion-purged enclosure filled with air and purged with nitrogen, according to one embodiment of the present invention. The enclosure has a length of 115.8 mm, a width of 93.8 mm, and a height of 4 mm. The enclosure is rectangular with a pair of shorter opposite sides and a pair of longer opposite sides. Each of the longer opposites sides has a rectangular slit 95.8 mm in length and 2 mm in height centered on the sides. Each of the shorter opposites sides has a rectangular slit 73.8 mm in length and 2 mm in height centered on the sides. The enclosure is enclosed in a chamber containing initially pure nitrogen. A flow rate of nitrogen is used to purge the chamber and maintain a high nitrogen concentration in the chamber. For a flow rate of 11,520 sccm of nitrogen into the chamber, it takes approximately 400 seconds to purge the enclosure to 1 ppm air. For a flow rate of 5750 sccm of nitrogen into the chamber, it takes approximately 2200 seconds to purge the enclosure to an average concentration of 1 ppm air.

Purging the Chamber Using Vacuum

Figure 7:
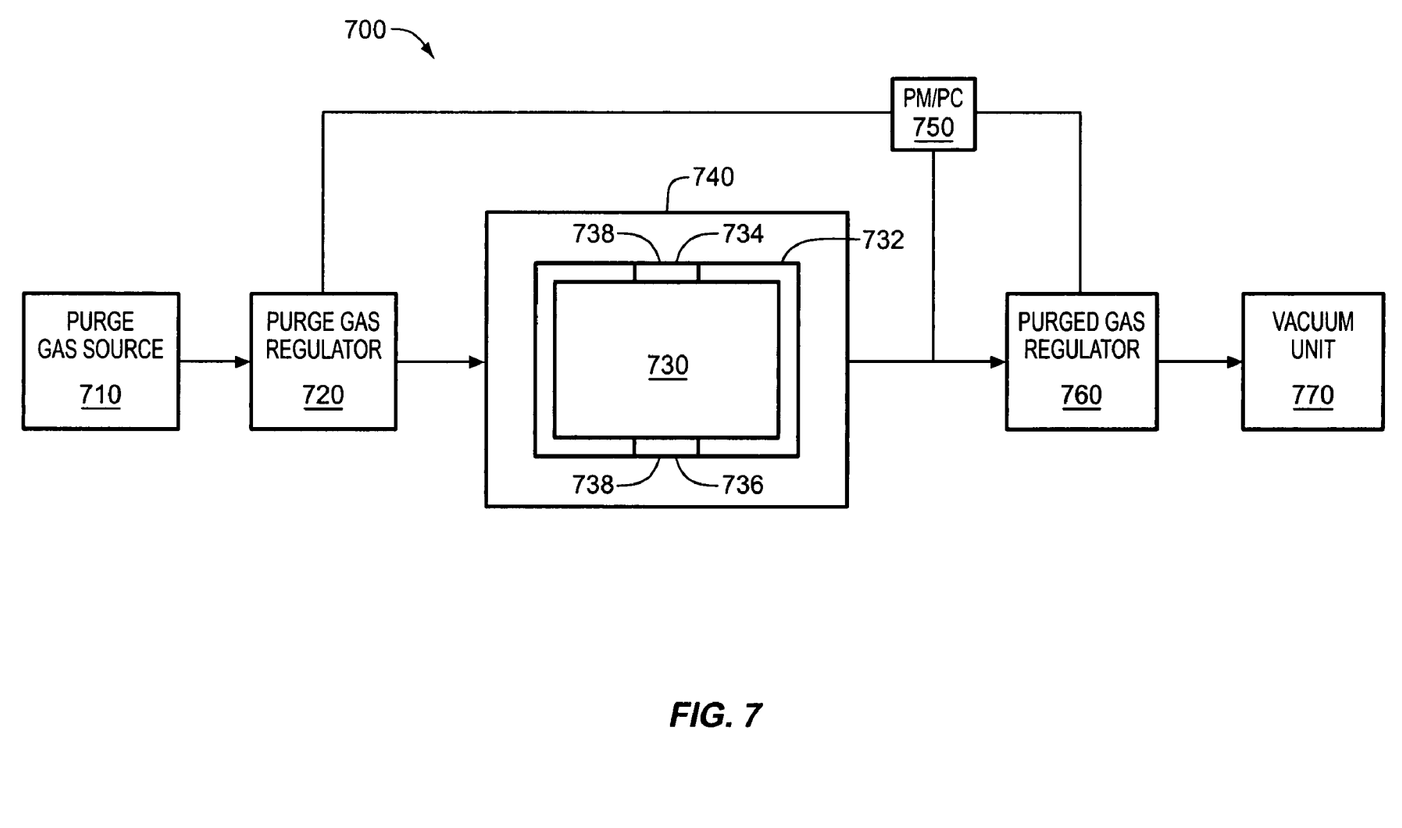
FIG. 7 shows a system for adding purge gas and removing initial gas from an enclosure, according to one embodiment of the present invention.

FIG. 7 shows a system 700 for purging a vacuum-purged enclosure 730, in which a vacuum unit 770 is used to remove initial gas from the vacuum-purged enclosure 730 and a purge gas source 710 is used to add purge gas to the vacuum-purged enclosure 730. The purge gas source 710, purge gas regulator 720, vacuum-purged enclosure 730, wall 732, vent 738, openings 734, 736, chamber 740, PM/PC unit, and purged gas regulator 760, may have any of the characteristics of the gas sources, regulators, enclosures, walls, vents, openings, chambers, and the PM/PC units discussed above. Only the distinctive features of system 700 will be discussed below.

The vacuum-purged enclosure 730 may be enclosed in the chamber 740 and the vacuum unit 770 coupled with the chamber 740, typically via the purged gas regulator 760, to remove gas from the chamber 740 and reduce the pressure of the chamber 740. Reducing the pressure of the chamber 740 removes initial gas from the vacuum-purged enclosure 730 through the enclosure openings 734, 736 and reduces the pressure of the vacuum-purged enclosure 730. The purge gas source 710 is coupled with the chamber 740, typically via the purge gas regulator 720, to add purge gas to the chamber 740. Adding purge gas to the chamber 740 adds purge gas to the vacuum-purged enclosure 730, either by concentration driven diffusion, or by pressure driven gas flow.

The chamber 740 is able to withstand the lowest internal vacuum pressure associated with vacuum unit 770. The chamber 740 allows the vacuum-purged enclosure 730 to be designed for the maximum expected difference in pressure between the vacuum-purged enclosure 730 and the chamber 740, which may be significantly less than the maximum expected difference in pressure between the vacuum-purged enclosure 730 and atmospheric pressure. This may simplify the mechanical design and redesign of the vacuum-purged enclosure 730 for use in the vacuum environment. Prior art pellicle-reticle systems have not been designed for vacuum.

The enclosure openings 732 and 734 may be large enough to allow the enclosure pressure to quickly adjust to chamber pressure and permit the vacuum-purged enclosure 730 to be designed to any desired vacuum design pressure. The enclosure openings 734, 736 are located sufficiently distant from an add location where purge gas is added to the chamber 740 and a remove location where gas is removed from the chamber 740. This may slow or buffer pressure changes on the vacuum-purged enclosure 730 and reduce direct channeled gas flow from the add location to the remove location.

The vacuum unit 770 reduces the pressure in the vacuum-purged enclosure 730. The vacuum unit 770 may be a rotary device, reciprocating device, molecular drag device, or vapor pump. For example, the vacuum unit 770 may include a chamber with a suction vent, exhaust vent, and a motor to rotate rotors within a compression chamber and draw gas through the suction vent and expel gas through the exhaust vent. The vacuum unit 770 may be a vacuum unit 770 typically found in semiconductor manufacturing facilities and may be used for other semiconductor manufacturing operations, such as etching, ion implantation, and thin film deposition. The vacuum unit 770 is used to reduce the pressure of the chamber 740, typically slowly to avoid damaging the vacuum-purged enclosure 730, which removes initial gas from the vacuum-purged enclosure 730 into the chamber 740 through the openings 734, 736. This allows the initial gas to be removed from the vacuum-purged enclosure 730 with very low risk that particles will enter the vacuum-purged enclosure 730. After a sufficient quantity of initial gas has been removed from the vacuum-purged enclosure 730, the suction provided by the vacuum unit 770 may be reduced or eliminated, typically slowly to prevent damage and to prevent the flow from carrying particles into the vacuum-purged enclosure 730.

According to one embodiment, initial gas is removed from the vacuum-purged enclosure 730 before purge gas is added to the vacuum-purged enclosure 730. Then purge gas is added to the chamber 740 and either diffuses or flows into the vacuum-purged enclosure 730. Reducing gas with the vacuum unit 770 and adding gas from the purge source 710 may be repeated any number of times, to achieve the desired extent of purging. Removing the initial gas before adding the purge gas significantly reduces mixing between initial gas and purge gas, and may allow the vacuum-purged enclosure 730 to be purged to the desired extent with less purge gas than needed for other approaches discussed.

According to another embodiment, the purge gas source 710 adds purge gas to the chamber 740 and the vacuum unit 770 simultaneously removes purge gas and initial gas from the chamber 740. Purge gas may be added to the vacuum-purged enclosure 730 so that it sweeps initial gas from the vacuum-purged enclosure 730. For example, this may be achieved by locating the enclosure openings 734, 736 proximate an add location and a remove location to encourage channel flow into the vacuum-purged enclosure 730.

The chamber 740 may also be eliminated. However, this may not be preferred if it becomes difficult or prohibitively expensive to design the vacuum-purged enclosure 730 to withstand the vacuum associated with the vacuum unit 770.

Consider an exemplary vacuum-purged enclosure filled with air and purged with nitrogen, according to one embodiment of the present invention. The enclosure has a length of 115.8 mm, a width of 93.8 mm, and a height of 4 mm. The enclosure is rectangular with a pair of shorter opposite sides and a pair of longer opposite sides. Each of the longer opposites sides has a rectangular slit 95.8 mm in length and 2 mm in height centered on the sides. Each of the shorter opposites sides has a rectangular slit 73.8 mm in length and 2 mm in height centered on the sides. The enclosure is enclosed in a chamber attached to a vacuum source. A vacuum of approximately 1 millimeter of mercury is gradually created in the chamber and in the vacuum-purged enclosure over a period of approximately 1-2 minutes. Then nitrogen is added to the chamber, using a flow rate that is approximately 141 sccm, while maintaining the vacuum running. This is done for approximately five minutes. Then the vacuum is stopped and the pressure in the chamber and in the enclosure is gradually increased to atmospheric pressure by adding nitrogen at a flow rate of approximately 141 sccm. This results in the enclosure having an average concentration of approximately 1 ppm air, or less.

Method for Purging the Chamber

Figure 8:
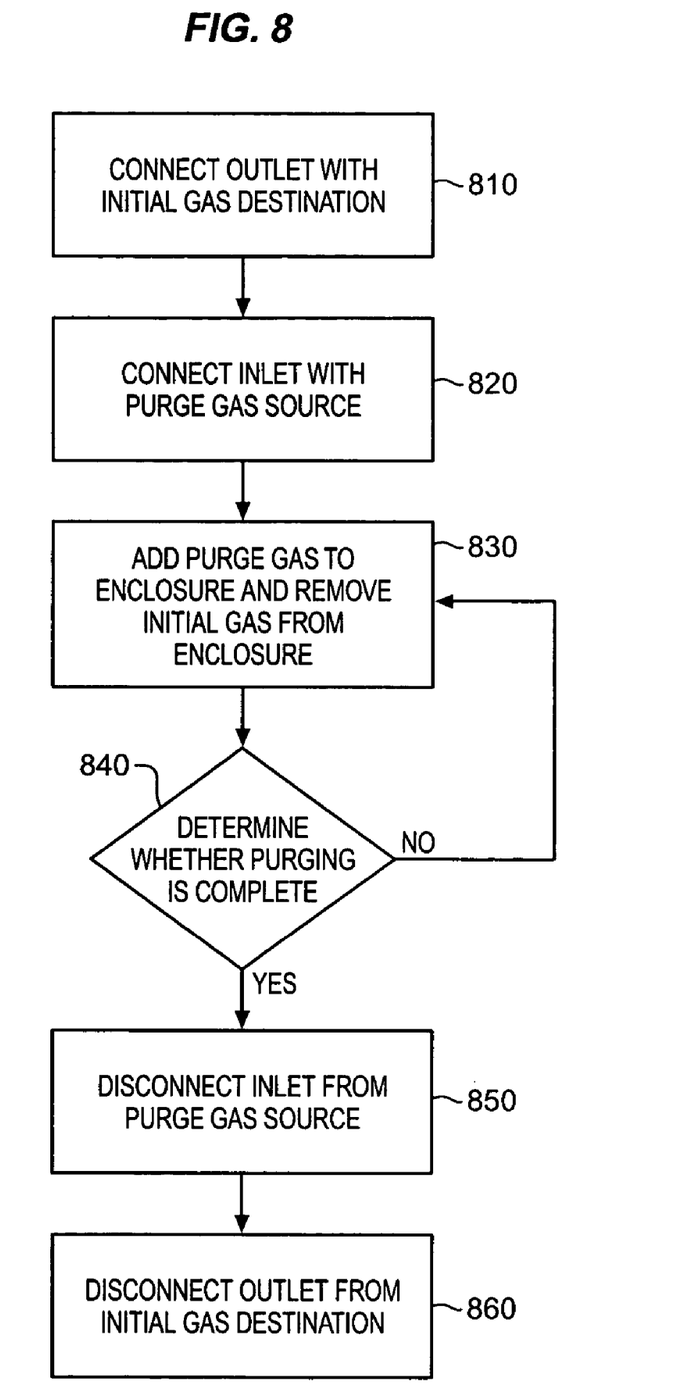
FIG. 8 shows a method for adding a purge gas to an enclosure and removing an initial gas from an enclosure, according to one embodiment of the present invention.

The method is generally characterized by but not limited to the following blocks shown in FIG. 9. At block 910 an outlet opening of an enclosure is connected with an initial gas destination. For example, the outlet opening may be coupled with the initial gas destination by adjusting a regulator, such as a valve, that allows initial gas in the enclosure to flow to the destination. At block 920 an inlet opening of the enclosure is connected with the purge gas source. The purge gas source may be a pressurized gas source or other source containing a quantity of purge gas. Connecting may include adjusting a regulator, such as a valve, to allow purge gas to be added to the enclosure through the inlet opening. Performing block 910 before block 920 reduces the risk that pressure in the enclosure will increase rapidly. Alternatively, blocks 910 and 920 may be done substantially simultaneously, or block 920 may be done before block 910, which may be advantageous if the initial gas destination is at a significantly lower pressure than the enclosure to avoid vacuum in the enclosure.

At block 930, a first quantity of purge gas from the purge gas source is added to the enclosure through the inlet opening and a second quantity of initial gas is removed from the enclosure to the initial gas destination via the outlet opening. Adding and removing may be done simultaneously, to prevent the pressure from increasing or decreasing in the enclosure, but this is not a limitation of the present invention.

Purge gas may be added from a higher-pressure location and the initial gas may be removed to a lower-pressure location. For example, purged gas may be added with a pressurized cylinder, blower, or a compressor.

The purge gas may also be added and removed from the enclosure by diffusion. For example, the enclosure may be surrounded by purge gas, or be enclosed in a chamber filled with purge gas, and a net quantity of purge gas may be added from the chamber to the enclosure, and a net quantity of initial gas may be removed from the enclosure to the chamber, by diffusion. Thus, the initial gas destination and the purge gas source may be the same, and the inlet opening and the outlet opening may be the same, according to this embodiment of the invention. In some embodiments, the temperature of the initial gas in the enclosure and/or the temperature of the purge gas in the chamber may be increased, such as by heating it with radiation, to increase the rate of diffusion.

According to certain embodiments, the pressure inside the enclosure may be reduced significantly below atmospheric pressure. Typically, the enclosure will be enclosed in a chamber, a vacuum will be pulled on the chamber, the chamber will communicate or pull the vacuum on the enclosure via an enclosure opening, and gas will be removed from the enclosure due to the vacuum in the chamber. Any level of vacuum may be used, such as 1 millimeter of mercury. This may permit nearly all of the initial gas to be removed from the enclosure. The risk of particles entering the enclosure is low, since flow is out of the enclosure. The vacuum can be broken slowly and then purge gas can be slowly added to the chamber and the enclosure to increase the pressure to atmospheric. Depending on the extent of purging desired, these operations may be repeated any number of times.

At block 940, gas in the enclosure or gas removed from the enclosure is analyzed to determine whether purging is complete. The analysis may be a real-time or near real-time concentration measurement, such as spectroscopy, chromatography, conductivity, or other analytical measurement. The analysis is compared to predetermined criteria, or concentration that indicates that the purging process is sufficiently complete. If the analysis indicates that purging is not complete 942, typically no action is taken and additional purge gas is added and initial gas is removed from the enclosure. If the analysis indicates that purging is complete 944 the method resumes to block 950.

At block 950, the inlet opening is disconnected from the purge gas source. For example, the operations of block 920 may be reversed. The enclosure may be decoupled from the purge gas source to create a sufficiently airtight seal between the enclosure and the purge gas source.

At block 960, the outlet opening is disconnected from the initial gas destination. This may include reversing the operations of block 910. The enclosure may be decoupled from the initial gas destination to create a sufficiently airtight seal. Blocks 950 and 960 may be performed simultaneously or block 960 may be done before block 950, such as may be advantageous if the initial gas destination includes a vacuum.

In conclusion, the present invention provides an approach for removing an initial gas from between a mask-protective device, such as a pellicle, and a patterned mask, such as a reticle. Broadly stated, embodiments of the present invention seek to remove the initial gas from a gas-filled enclosure between the mask-protective device and the patterned mask by replacing the initial gas with a purge gas that is different from the initial gas.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising:
adding a first gas to an enclosure having a second gas through an inlet port having a plurality of discrete openings arranged to distribute a flow of the first gas over a length of a side of the enclosure, the first gas having a different composition than the second gas, the enclosure being between a mask protective device, a patterned mask, and walls connecting the mask protective device with the patterned mask, wherein the openings are in the walls connecting the mask protective device with the patterned mask; and
removing at least a portion of the second gas from the enclosure through one or more outlet ports.

2. The method of claim 1, wherein the inlet port comprises a slit in a wall.

3. The method of claim 1, wherein said removing comprises removing the second gas by vacuum.

4. The method of claim 1, wherein said adding comprises adding the first gas through an inlet port that is smaller than an outlet port.

5. The method of claim 1, wherein the openings of the inlet port are on said side of the enclosure.

6. The method of claim 1, wherein said adding comprises adding the first gas through at least five openings of the inlet port.

7. The method of claim 1, wherein the plurality of openings of the inlet port are arranged to encourage plug flow through the enclosure.

8. The method of claim 1, wherein said adding and said removing comprise adding the first gas by diffusion and removing the second gas by diffusion.

9. A method comprising:
adding a first gas to an enclosure having a second gas through an inlet port having a shape to distribute a flow of the first gas over a length of a side of the enclosure, the first gas having a different composition then the second gas, the enclosure being between a mask protective device, a patterned mask, and walls connecting the mask protective device with the patterned mask;
removing at least a portion of the second gas from the enclosure through one or more outlet ports,
wherein said adding and said removing comprise adding the first gas by diffusion and removing the second gas by diffusion; and
heating a gas in the enclosure to increase a diffusion coefficient.

10. A method comprising:
adding a first gas to an enclosure including a second gas through a vent including a plurality of openings to distribute a flow of the first gas over a length of a side of the enclosure, the first gas having less total oxygen and carbon than the second gas, the enclosure being between a pellicle, a mask, and walls connecting the pellicle with the mask, wherein said adding comprises adding the first gas through a slit in a wall; and
removing at least a portion of the second gas from the enclosure.

11. A method comprising:
adding a first gas to an enclosure including a second gas through a vent including a plurality of openings to distribute a flow of the first gas over a length of aside of the enclosure, the first gas having less total oxygen and carbon than the second gas, the enclosure being between a pellicle, a mask, and walls connecting the pellicle with the mask, wherein said openings are in a wall; and
removing at least a portion of the second gas from the enclosure.

12. The method claim 11, wherein two or more of the plurality of openings are on same side of the enclosure.

13. The method of claim 11, wherein said adding comprises adding the first gas through an inlet opening that is smaller than an outlet opening used to remove the second gas.

14. The method of claim 11, wherein said adding comprises adding the first gas through at least five openings of the vent.

15. The method of claim 14, wherein the at least five openings are on a same side of the enclosure.

16. The method of claim 11, wherein said adding comprises adding the first gas through a plurality of openings that are arranged to encourage plug flow through the enclosure.

17. The method of claim 11, wherein said removing comprises removing the second gas by creating a vacuum in the enclosure.

* * * * *

UNITED STATES PATENT AND TRADEMARK OFFICE
CERTIFICATE OF CORRECTION

PATENT NO. : 7,256,872 B2  Page 1 of 1
APPLICATION NO. : 10/759641
DATED : August 14, 2007
INVENTOR(S) : Wu et al.

It is certified that error appears in the above-identified patent and that said Letters Patent is hereby corrected as shown below:

Column 16, at line 4, delete "then" and insert --than--.

Column 16, at line 6, delete "wails" and insert --walls--.

Column 16, at line 29, delete "aside" and insert --a side--.

Signed and Sealed this

Eighth Day of April, 2008

JON W. DUDAS
*Director of the United States Patent and Trademark Office*